United States Patent
Sunaga

(10) Patent No.: US 7,460,420 B2
(45) Date of Patent: Dec. 2, 2008

(54) SEMICONDUCTOR STORAGE DEVICE

(75) Inventor: Toshio Sunaga, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/553,617

(22) Filed: Oct. 27, 2006

(65) Prior Publication Data

US 2007/0097761 A1  May 3, 2007

(30) Foreign Application Priority Data

Oct. 28, 2005 (JP) ............... 2005-314601

(51) Int. Cl.
*G11C 7/00* (2006.01)
(52) U.S. Cl. ............... 365/200; 365/230.06
(58) Field of Classification Search .......... 365/200, 365/230.06, 189.07
See application file for complete search history.

(56) References Cited

U.S. PATENT DOCUMENTS 5,047,983 A * 9/1991 Iwai et al. ............. 365/200
5,617,365 A * 4/1997 Horiguchi et al. ........ 365/200
5,959,908 A * 9/1999 Shiratake ................ 365/200

FOREIGN PATENT DOCUMENTS

| JP | 1208798 | 8/1989 |
|----|---------|--------|
| JP | 2558787 | 8/1989 |
| JP | 2001093292 | 4/2001 |
| JP | 2001093294 | 4/2001 |

OTHER PUBLICATIONS

ULSI Dram Technology.

* cited by examiner

*Primary Examiner*—Anh Phung
(74) *Attorney, Agent, or Firm*—W. Riyon Harding

(57) ABSTRACT

The objective of the present invention is to provide a DRAM that reduces the current consumed by an address comparison circuit that compares an address signal with a defective address signal that has been programmed. Redundant predecoders predecode a defective row address signal DRA output by program circuits, and an address comparison circuit compares a predecoded signal, output by a predecoder, with the defective predecoded signals PDRA, output by the redundant predecoders. In the case of a 2-bit predecoding system, the address comparison circuit compares the predecoded signal PRA with the defective predecoded signal PDRA using four bits in order to compare the row address signal RA with the defective row address signal DRA using groups of two bits.

7 Claims, 14 Drawing Sheets

SEMICONDUCTOR STORAGE DEVICE

FIELD OF THE INVENTION

The present invention relates to a semiconductor storage device, and relates more particularly to the improvement of a semiconductor storage device having a redundant circuit.

BACKGROUND OF THE INVENTION

For a common DRAM (Dynamic Random Access Memory), to substitute for a defective memory cell and to improve production yield, a redundant circuit is arranged, for rows and columns that provides a spare word line and a spare column selection line that corresponds to and can be used to replace those of the defective memory cell.

When a wafer is tested and a defective word line is found, address data for the defective word line is prepared. Following this, a fuse is blown by a laser in accordance with the address data, and programming is performed for a defective address. As a result, when that programmed address is accessed, for example, the spare word line, which is used to replace the word line wherein the defective memory cell is present, is driven. Therefore, for the redundant circuit, an address comparison circuit is included that compares, for each access, an external row address, for example, provided for a defective row address that has been programmed. Also during a refresh process, the address comparison circuit compares a row address for a word line to be refreshed with a defective row address.

A redundant circuit for a DRAM is large and consumes a large amount of a current. In order to maintain the effectiveness and the flexibility with which a substitution can be provided for a defective cell, spare word lines and spare column selection lines are provided for each ½ or ¼ block division of a large array block, instead of for a number of smaller array blocks, and spare memory cells are available to replace all defective memory cells in the large array block.

When a thus arranged DRAM is externally accessed, or refreshed at each access, an address is compared with all addresses that have been programmed. Therefore, the current required for the address comparison circuit comprises a considerably large portion of all the current consumed. And thus, though there exist demands for reductions both in an operating current for a DRAM and in a standby current used for refreshing a DRAM, especially requested is a reduction in the current consumed by the redundant circuit.

SUMMARY OF THE INVENTION

The object of the present invention is to provide a semiconductor storage device for which a reduced current is consumed by an address comparison circuit that compares an address signal with a defective address signal that has been programmed.

A semiconductor storage device according to the present invention comprises: a plurality of selection lines and a spare selection line; a program circuit; an address comparison circuit; a decoder; and a spare decoder. The program circuit can program a defective address, and can generate a defective address signal indicating a defective address that has been programmed. The address comparison circuit collectively compares a plurality of bits for an address signal with a plurality of corresponding bits for the defective address signal, and when the individual bits match, it activates a first match signal, or when the individual bits do not match, it deactivates the first match signal. The decoder is activated in accordance with the deactivation of the first match signal, and drives the selection lines in accordance with the address signal. The spare decoder drives the spare selection line in accordance with the activation of the first match signal.

When the address signal matches the defective address signal, the decoder of the semiconductor storage device is deactivated, and does not drive the selection lines. Instead of the selection lines, the spare selection lines are driven. At this time, since the address comparison circuit collectively compares multiple bits for the address signal and the defective address signal, the current consumed is lower than when comparison is performed bit by bit.

An example selection line can be a word line and a column selection line, and an example decoder can be a row decoder and a column decoder. An example spare decoder can be a spare row decoder and a spare column decoder. An example address signal can be a row address signal used for an external access, a row address signal used for refreshing, and a column address signal used for an external access. An example defective address signal can be a defective row address signal and a defective column address signal.

The spare selection line is not limited to a single line, and a plurality of spare selection lines may be provided. When a plurality of spare selection lines are provided, a plurality of corresponding program circuits are also arranged, and accordingly, a plurality of first match signals are generated. When all the first match signals are deactivated, the decoder is activated, and when one of the match signals is activated, the decoder is deactivated.

Preferably, the semiconductor storage device further comprises: a predecoder and a redundant predecoder. The predecoder predecodes an address signal and generates a predecoded signal. The redundant predecoder predecodes a defective address signal, and generates a defective pedecoded signal. The address comparison circuit also includes a predecode comparator for comparing a predecoded signal with a defective predecoded signal.

Preferably, the predecode comparator includes a plurality of bit comparators and a logic circuit. Each of the bit comparators compares a plurality of bits for a predecoded signal with a plurality of corresponding bits for a defective predecoded signal, and when the individual bits match, it activates a second match signal, or when the individual bits do not match, it deactivates a second match signal. The logic circuit activates the first match signal in accordance with the activation of all the second signals output by the bit comparators.

In this case, the number of nodes charged or discharged in the address comparison circuit is reduced, as is the current consumed.

Preferably, at least one of the bit comparators is activated in accordance with second match signals output by the remaining bit comparators.

In this case, so long as at least one of the bit comparators does not activate the second match signal, the other bit comparators are not operated and unnecessary operation of the bit comparators does not occur, so that current consumption can be reduced even further.

Preferably, the semiconductor storage device further comprises: a master fuse circuit. The master fuse circuit activates a master fuse signal when a defective address in the program circuit is programmed, or it deactivates a master fuse signal when a defective address in the program circuit is not programmed. The redundant predecoder is activated in accordance with the activation of the master fuse signal, and is deactivated in accordance with the deactivation of the master fuse signal.

In this case, so long as the defective address in the program circuit is not programmed, the redundant predecoder is not operating so that current consumption can be reduced even further.

DETAILED DESCRIPTION OF THE INVENTION

Figure 1:
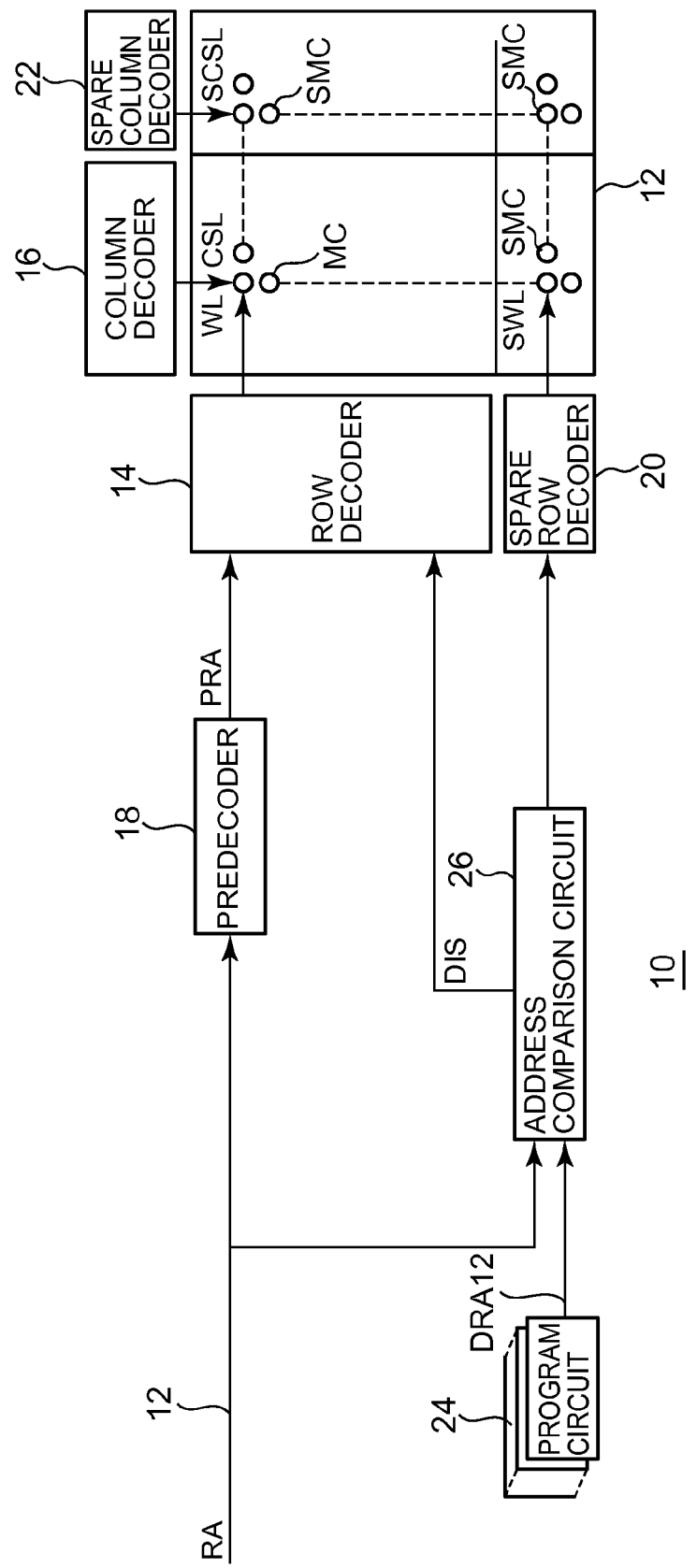
FIG. 1 is a functional block diagram showing the general configuration of a conventional DRAM.

The preferred embodiment of the present invention will now be described in detail while referring to the drawings. The same reference numerals are provided throughout for the same or corresponding components, and explanations given for them will not be repeated. A "b" provided for a signal indicates that the pertinent signal is active low. The high logic level is indicated by "H level", and the low logic level is indicated by "L level".

Before the embodiment of the present invention is explained, the configuration and the operation of a conventional DRAM will be described.

Referring to FIG. 1, a conventional DRAM 10 comprises a memory cell array 12, which includes a plurality of memory cells MC arranged in rows and in columns, a plurality of word lines WL which are arranged in the rows of the memory cell array 12, a plurality of column selection lines CSL which are arranged in the columns of the memory cell array 12, a row decoder 14 which selectively drives the word lines WL, a column decoder 16 which selectively drives the column selection lines CSL, and a predecoder 18 which predecodes an externally provided row address signal RA and generates a predecoded signal PRA.

The DRAM 10 further includes a redundant circuit. Specifically, the memory cell array 12 includes a plurality of spare memory cells SMC arranged in spare rows and spare columns. The DRAM 10 further includes a plurality of spare word lines SWL, arranged in the spare rows, a plurality of spare column selection lines SCSL, arranged in the spare columns, a spare row decoder 20 which selectively drives the spare word lines SWL, and a spare column decoder 22 which selectively drives the spare column selection lines SCSL.

Hereinafter, a common memory cell may be referred to as a "normal memory cell", in order to distinguish it from a spare memory cell; a common word line may be referred to as a "normal word line", in order distinguish it from a spare word line; a common column selection line may be referred to as a "normal column selection line", in order to distinguish it from a spare column selection line; a common row decoder may be referred to as a "normal row decoder", in order to distinguish it from a spare row decoder; and a common column decoder may be referred to as a "regular column decoder", in order to distinguish it from a spare column decoder.

DRAM 10 also includes, as redundant circuits, a plurality of program circuits 24 and an address comparison circuit 26. The program circuits 24 program the row addresses of the normal word lines WL that are connected to the defective normal memory cells MC, and can generate defective row address signals DRA, used to indicate row addresses that have been programmed. The address comparison circuit 26 compares an externally provided row address signal RA with each of the defective row address signals RDA output by the individual program circuits 24. Thus, when the row address signal RA matches one of the defective row address signals RDA, the address comparison circuit 26 can activate a disable signal DIS, and when the row address signal RA does not match any of the defective row address signals RDA, it can deactivate the disable signal DIS. The normal row decoder 14 is deactivated in accordance with the activation of the disable signal DIS, or is activated in accordance with the deactivation of the disable signal DIS.

Recently, 4K normal word lines WL and 64 to 128 spare word lines SWL have been provided for a DRAM 10 of 64M to 256M bits, and in order to select one of the 4K normal word lines WL, a row address signal RA of 12 bits is externally provided. When 64 spare word lines SWL are so arranged, 64 corresponding program circuits 24 are likewise arranged. A defective row address is programmed in the individual program circuits 24, and the program circuits 24 generate defective row address signals DRA of 12 bits. When a defective row address is programmed in all the 64 program circuits 24, 64 different defective row address signals DRA are output.

Generally, the row address signal RA is externally provided to be used for accessing or refreshing, or is internally generated. In the following explanation, in order to be distinguished from the defective row address signal, the row address signal RA is described as an "external row address signal", and an example wherein 64 spare word lines SWL are arranged is employed.

Figure 2:
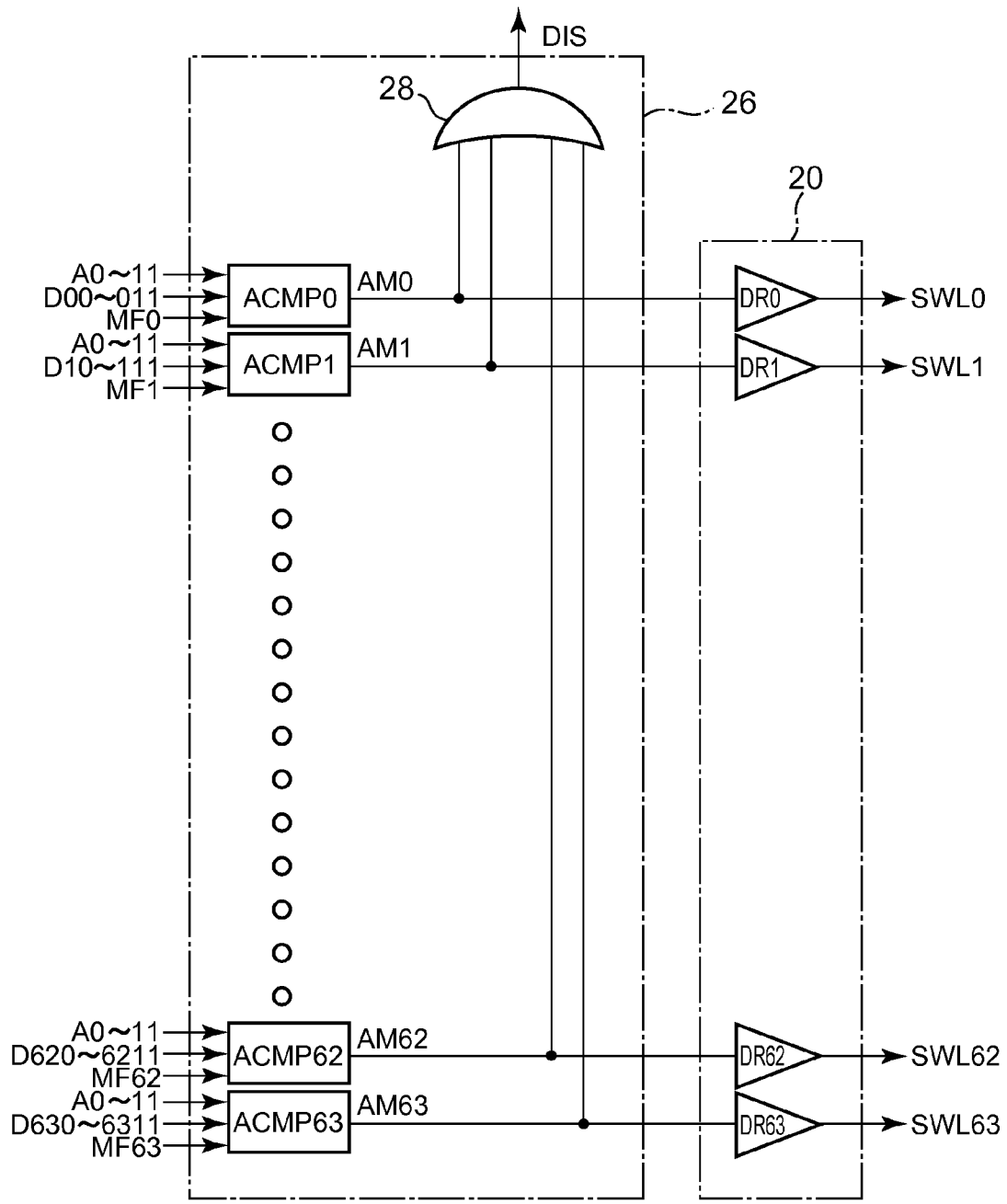
FIG. 2 is a functional block diagram showing an address comparison circuit and a spare row decoder in FIG. 1.

Referring to FIG. 2, an address comparison circuit 26 includes: 64 address comparators ACMP0 to ACMP63, which correspond to 64 program circuits 24, and one OR circuit 28. For example, the address comparator ACMP0 compares, for each bit, twelve 1-bit external address signals A0 to A11 with twelve 1-bit defective row address signals D00 to D011 that are output by the corresponding program circuits 24. When all the bits match, the address comparator ACMP0 activates an address match signal AM0, and when even one bit does not match, it deactivates the address match signal AM0. The same process is applied for the other address comparators ACMP1 to ACMP63. The OR circuit 28 receives address match signals AM0 to AM63 from the 64 address comparators ACMP0 to ACMP63, and outputs a disable signal DIS. When one of the 64 address match signals AM0 to AM63 is activated, the disable signal DIS is also activated.

The spare row decoder 20 includes 64 drivers DR0 to DR63 that correspond to the 64 program circuits 24 and the 64 spare word lines SWL0 to SWL 63. For example, the driver DR0 drives the spare word line SWL0 in accordance with the address match signal AM0 that is output by the corresponding address comparator ACMP0. The same process is applied for the other drivers DR1 to DR63.

Figure 3:
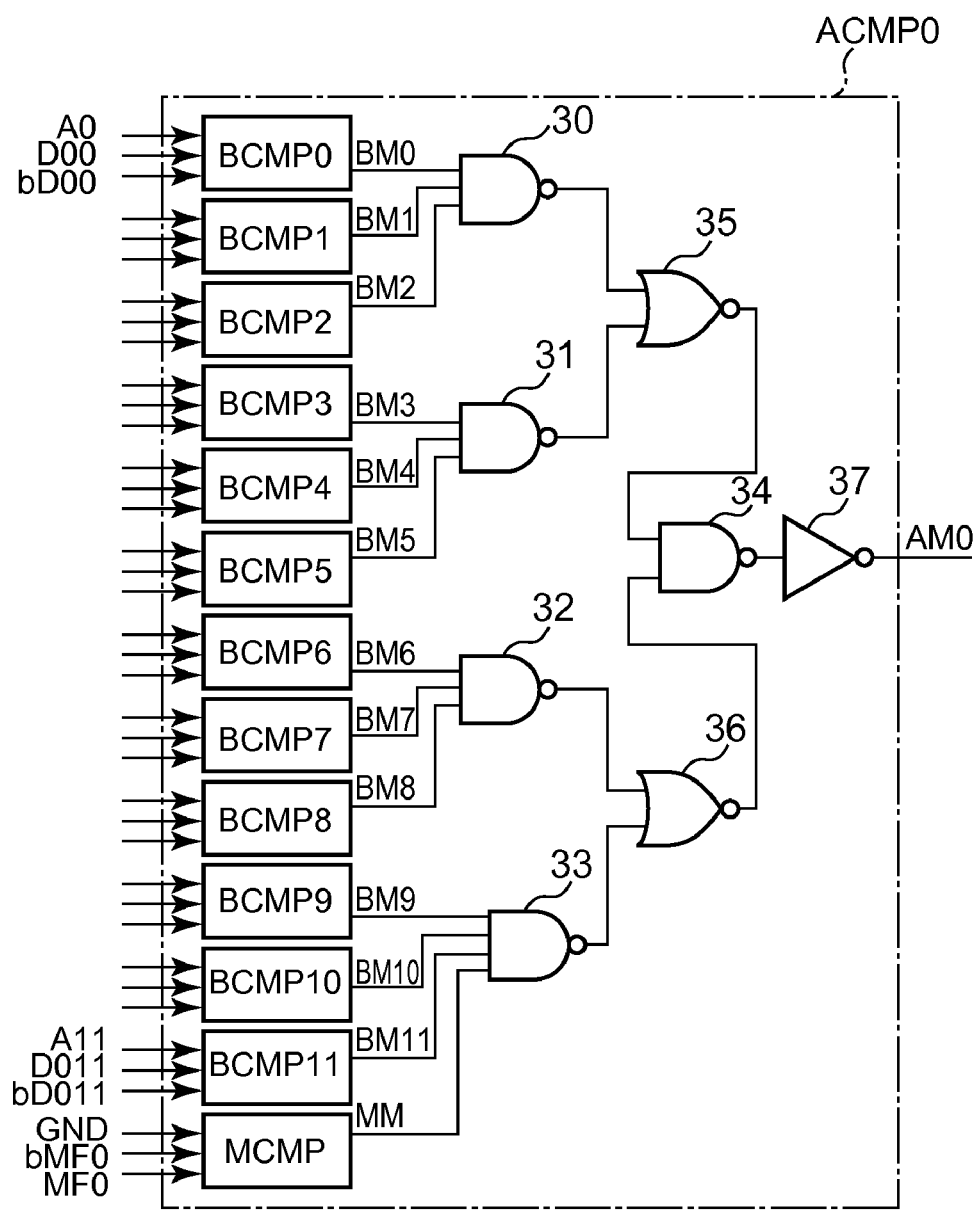
FIG. 3 is a functional block diagram showing an address comparator in FIG. 2.

Referring to FIG. 3, for example, the address comparator ACMP0 includes 12 bit comparators BCMP0 to BCMP11, in consonance with the number of bits of the defective row address signal DRA; NAND circuits 30 to 34; OR circuits 35 and 36; and an inverter circuit 37. The same arrangement is applied for the other address comparators ACMP1 to ACMP63.

The bit comparator BCMP0 compares bit A0 of the external row address signal RA with corresponding bits D00 and bD00 of the defective row address signal DRA that are received from a corresponding program circuit 24. When the bits match, the bit comparator BCMP0 activates a bit match signal BM0 to level H, and when the bits do not match, it deactivates the bit match signal BM0 to level L. The same process is applied for the other comparators BCMP1 to BCMP11.

Figure 4:
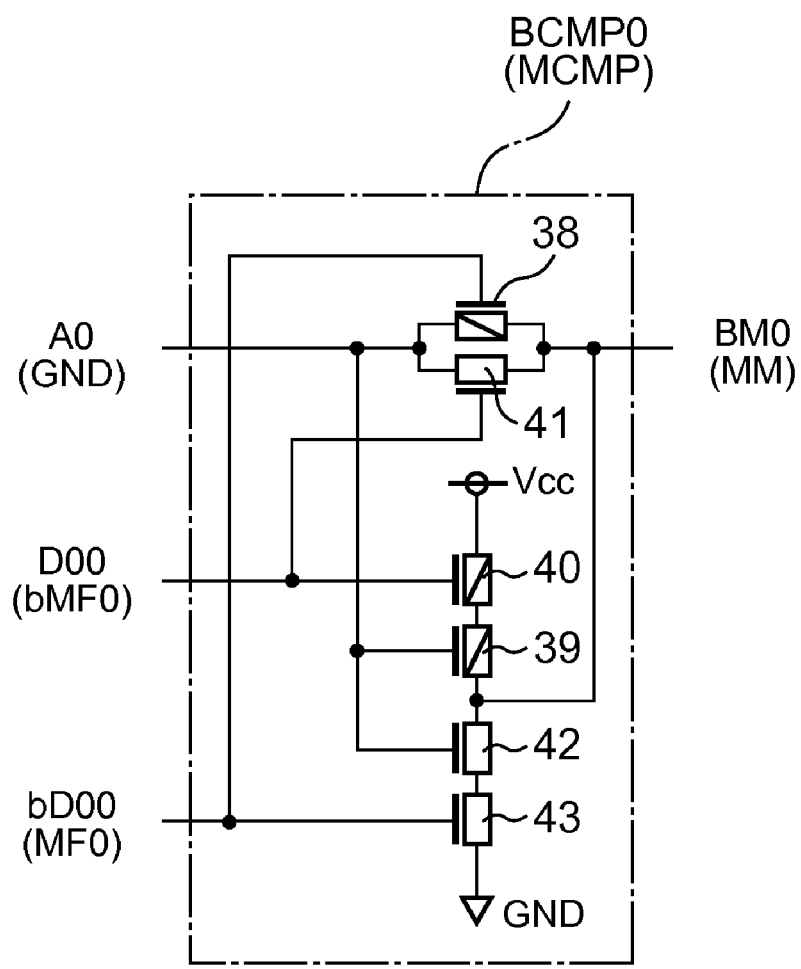
FIG. 4 is a circuit diagram showing the bit comparator or a master comparator of FIG. 3.

While referring to FIG. 4, the bit comparator BCMP0 includes, for example, P channel MOS transistors 38 to 40 and N channel MOS transistors 41 to 43. The transistors 38 and 41 constitute a transfer gate, while the transistors 39, 40, 42 and 43 constitute a tristate inverter. The same arrangement is applied for the other bit comparators BCMP1 to BCMP11.

Figure 5:
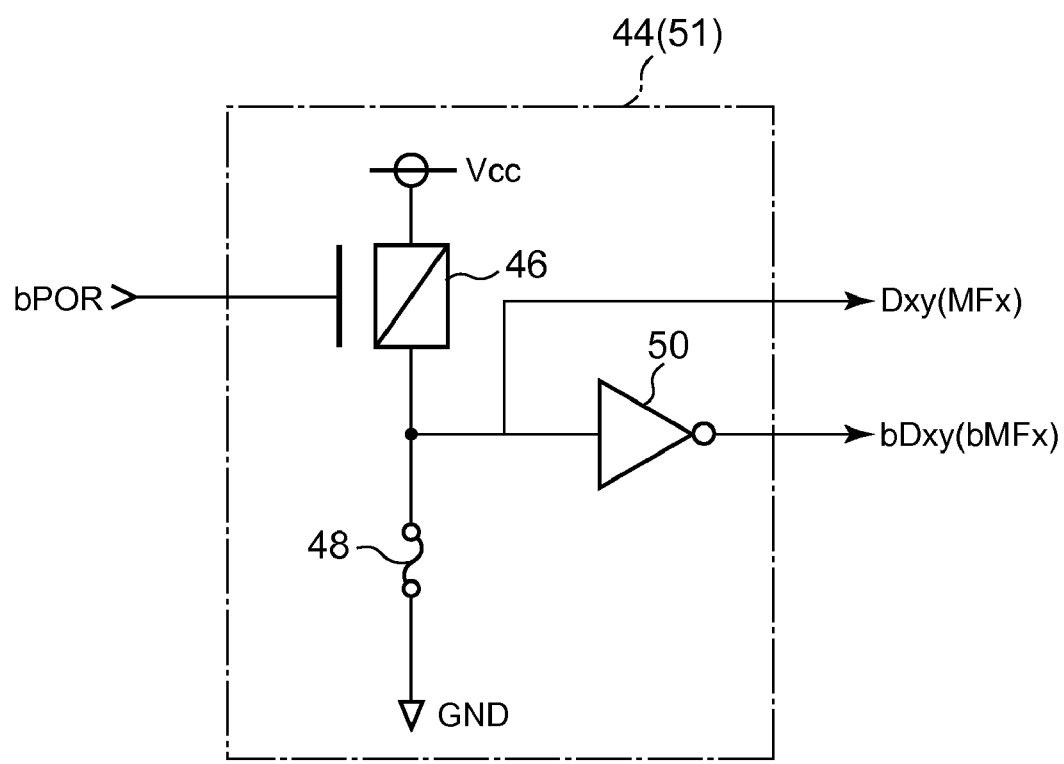
FIG. 5 is a fuse circuit or a master fuse circuit for one bit, included in a program circuit in FIG. 1.

Each of the program circuits 24 includes 12 fuse circuits 44, as shown in FIG. 5, in order to enable the programming of a defective row address of 12 bits. The fuse circuits 44 each include: a P channel MOS transistor 46, which is rendered on in accordance with the activation of a power-On reset signal bPOR; a fuse 48, which can be blown by a laser; and an inverter 50. Defective row address signals Dxy and bDxy output by each fuse circuit 44 are complementary signals. An x indicates 0 to 63 and corresponds to the number (64) for program circuits, while a y indicates 0 to 11, and corresponds to the number (12) of the bits of a defective row address signal.

When the fuse 48 is not cut off, the defective row address signal Dxy goes to level L, and the defective row address signal bDxy goes to level H. The uncut state of the fuse 48 indicates that "0" (level L) has been programmed for the pertinent bit of a defective row address. When the fuse 48 is cut, the defective row address signal Dxy goes to level H, and the defective row address signal bDxy goes to level L. The cut state of the fuse 48 indicates that a "1" (level H) is programmed in the pertinent bit of the defective row address.

When a "0" (level L) is programmed in the fuse circuit 44, the defective row address signal D00 for level L is output, and the defective row address signal bD00 for level H is output. Therefore, for the bit comparator BCMP0 in FIG. 4, a transfer gate (denoted by 38 and 41) is deactivated, and a tristate inverter (denoted by 39, 40, 42 and 43) is activated. At this time, when the row address signal A0 for level H is provided, the bit match signal BM0 is deactivated at level L, or when the row address signal A0 for level L is provided, the bit match signal BM0 is activated at level H.

When a "1" (level H) is programmed in the fuse circuit 44, the defective row address signal D00 for level H is output, and the defective row address signal bD00 for level L is output. Thus, for the bit comparator BCMP0 in FIG. 4, a transfer gate (denoted by 38 and 41) is activated and a tristate inverter (denoted by 39, 40, 42 and 43) is deactivated. At this time, when the row address signal A0 for level H is provided, the bit match signal BM0 is activated at level H, or when the row address signal A0 for level H is provided, the bit match signal BM0 is deactivated at level L.

When all 12 bits of the external row address signal RA match all 12 bits of the defective row address signal DRA that is programmed, all the 12-bit match signals BM0 to BM11, which are output by the twelve bit comparators BCMP0 to BCMP11, are activated at level H. As a result, the logic circuit (formed by 30 to 37) activates the address match signal AM0 at level H. When all the bits for the external row address signal RA do not match those of the defective row address signal DRA, the logic circuit (constituted by 30 to 37) deactivates the address match signal AM0 at level L.

While referring to FIG. 3 again, the address comparator ACMP0 includes a master comparator MCMP. The master comparator MCMP constantly compares a ground signal GND at level L with master fuse signals MF0 and bMF0. When these signals match, the master comparator MCMP activates a master match signal MM at level H, and when the signals do not match, it deactivates the master match signal MM at level L. The same arrangement as the bit comparator BCMP0 in FIG. 4 is employed for the master comparator MCMP.

Each of the program circuits 24 further includes, as shown in FIG. 5, a master fuse circuit 51 for generating master fuse signals MF0 and bMF0. The master fuse circuit 51 is the same as the fuse circuit 44.

When the fuse 48 is not cut off, the master fuse signal MF0 goes to level L, and the master fuse signal bMF0 goes to level H. The uncut state of the fuse 48 indicates that no defective row address has been programmed. At this time, the master comparator MCMP deactivates the master match signal MM at level L. As a result, regardless of the external row address signal, the address comparator ACMP0 deactivates the address match signal AM0 at level L.

When the fuse 48 is cut, the master fuse signal MF0 goes to level H, and the master fuse signal bMF0 goes to level L. The cut state of the fuse 48 indicates that a defect row address has been programmed. At this time, the master comparator MCMP activates the master match signal MM at level H. As a result, the address comparator ACMP0 is operated in the above described manner.

The redundant circuit arranged in a row has been described, and a redundant circuit arranged in a column has the same configuration.

As described above, when all the addresses of 12 bits match, all the nodes in the address comparator ACMP0 in FIG. 3 are charged or discharged, and the current consumed reaches the maximum. However, during a period in which all of the 4K addresses are accessed, the matching of addresses occurs only 64 times, at the maximum. Therefore, as for the refreshing process, wherein all the addresses are periodically accessed in order, the average current is not adversely affected by the above described current consumption. Rather, there is a problem in that, at each access, partial matches occur in the bits for addresses, and this phenomenon unnecessarily consumes current. Specifically, when the address match signal AM0 is at a level L at each access, charging/ discharging is performed for the nodes in the address comparator ACMP0. Since there are 64 address comparators ACMP0 to ACMP64, the charging and discharging is performed for multiple nodes at each access, and this causes a large amount of a current to be consumed.

As described above, when the disable signal DIS does not finally go to level H, many partial matches of addresses occur in the address comparators ACMP0 to ACMP63. An explanation will now be given for the process used to calculate the number of nodes charged and discharged due to the partial matching of addresses.

When the individual bits for a defective address signal DRA are at level L or H, and when a total of 4K addresses are accessed, the bits of the row address signal RA go to level H or L 2K times. Therefore, regardless of the defective row address signal DRA, the bit match signal BM is always activated for 2K accesses of the 4K accesses. Since 12 bit comparators BCMP0 to BCMP11 are provided, charging/discharging is performed for 24K (=2K×12) output nodes times 4K accesses.

Since the NAND circuits 30 to 33, located at the second stage of the address comparator ACMP0, each have a three-bit input, the output nodes thereof are charged/discharged for eight accesses. Therefore, for 4K accesses, the output nodes are charged/discharged 512 (=4K/8) times. Since the four NAND circuits 30 to 33 are provided, charging/discharging is performed for the output nodes of the NAND circuits 30 to 33 a total of 2K (512×4) times.

Further, since the signal output by the NOR circuit 35 or 36, located at the third stage, goes to level H once every 64 accesses, the output nodes of the NOR circuits 35 and 36 are charged/discharged a total of 128 (64×2) times.

As described above, in the address comparator ACMP0, the average number N of nodes to be charged/discharged during one access can be obtained using the following expression.

$$N=(2K\times12+512\times4+64\times3)/4K=6.53125$$

This means that, in each address comparator ACMP, about six nodes on average are charged/discharged during each access. Further, this value is the average per access obtained when both the access by which the disable signal DIS is finally activated and the access by which the disable signal is not activated are included. Since there are 64 address comparators, for each access, a total of 418 nodes are charged/discharged and a considerable amount of current is consumed.

As is apparent from the above described analysis results, in order to reduce the current consumed by the address comparison circuit 26, the occurrence of partial matches of addresses in the address comparators ACMP0 to ACMP63 needs to be reduced. In order to reduce the occurrence of partial match of addresses, a method for comparing addresses collectively for a plurality of bits, instead of for individual bits, is employed. This method is described according to an embodiment of the present invention.

Since a conventional DRAM 10 compares addresses for each bit, bits partially match once every two accesses. However, when, for example, an external 12-bit row address signal RA is grouped for every two bits, and a 12-bit defective row address signal DRA is also grouped for every two bits, when these signals are compared, partial matches of addresses occur only once for four accesses. Similarly, when a 12-bit address is grouped for every three bits, partial matches of addresses occur only once for eight accesses. Therefore, the number of nodes to be charged/discharged due to partial match can be considerably reduced, and current consumption can be lowered.

Figure 6:
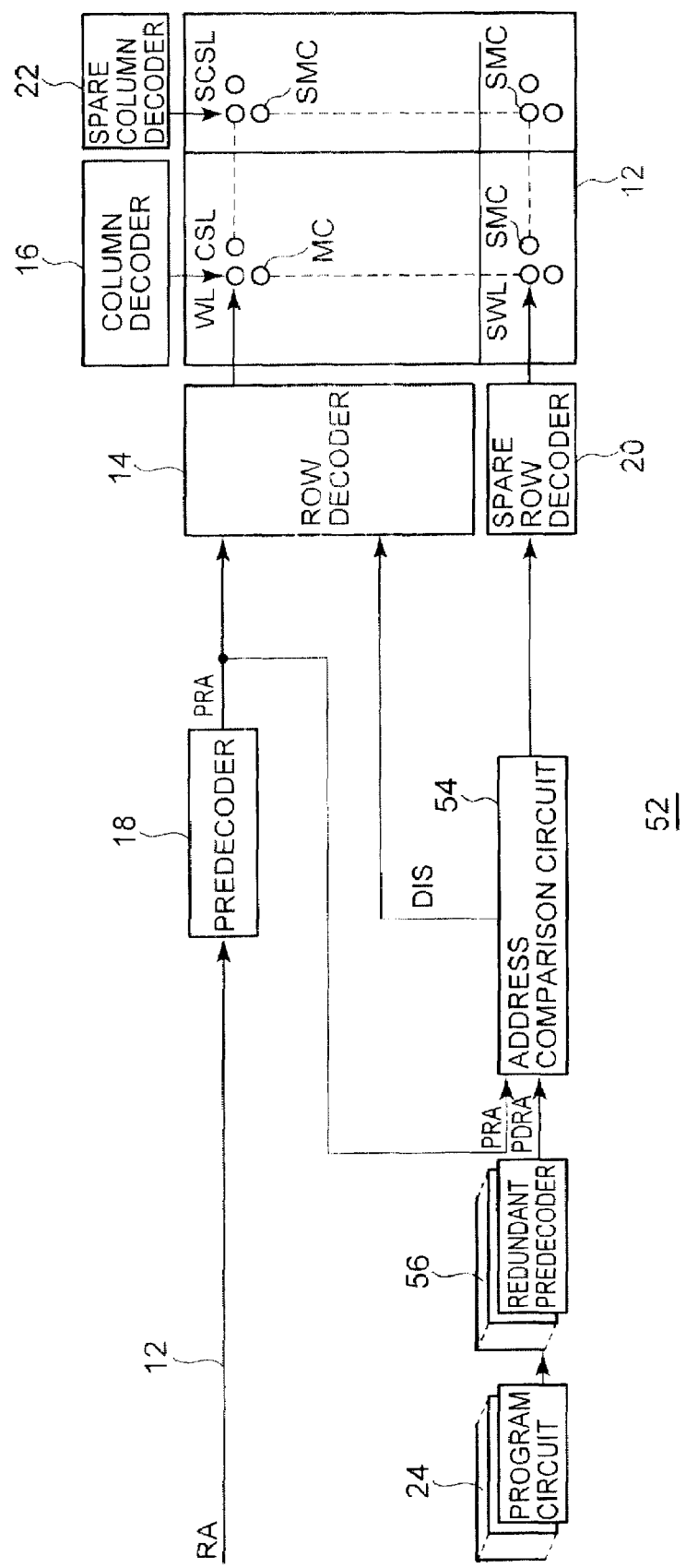
FIG. 6 is a functional block diagram showing the general configuration of a DRAM according to a first embodiment of the present invention.

FIG. 6 shows a first embodiment of the present invention. Referring to FIG. 6, unlike the conventional DRAM 10 shown in FIG. 1, a DRAM 52 for a first embodiment of the present invention includes: an address comparison circuit 54 and 64 redundant predecoders 56, used for a defective row address signal DRA. The address comparison circuit 54 compares a predecoded signal PRA, output by a predecoder 18 used for an external row address signal RA, with defective predecoded signals PDRA, output by the defective predecoders 56 used for the defective row address signal DRA. The individual redundant predecoders 56 for the defective row address signal DRA predecode defective address signals DRA, output by corresponding program circuits 24, and generate defective predecoded signals PDRA. The redundant predecoders 56 for a defective row address signal DRA basically employ the same structure as the predecoder 18 for the external row address signal RA.

Figure 7:
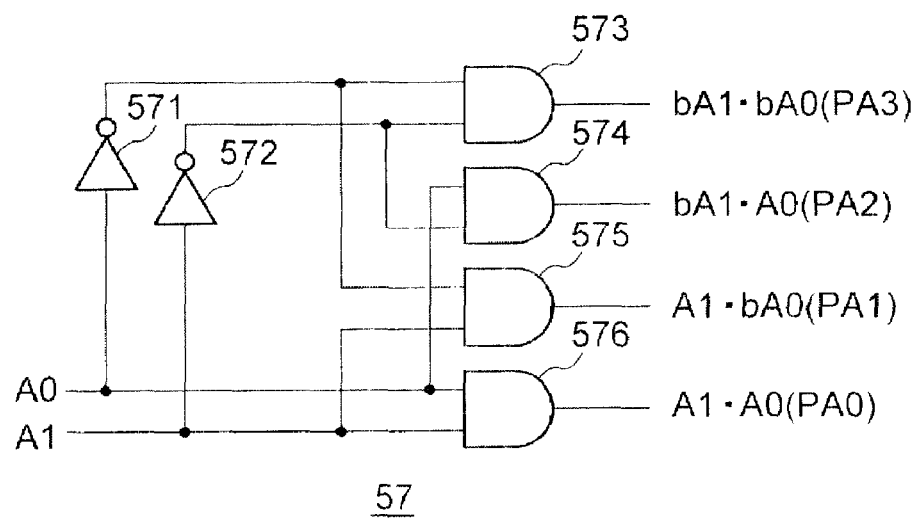
FIG. 7 is a circuit diagram showing a 2-bit predecoder included in the predecoder shown in FIG. 6.

The predecoder 18 for the row address signal RA includes a 2-bit predecoder 57, shown in FIG. 7, that handles two 1-bit external row address signals A1 and A0. The 2-bit predecoder 57 includes inverters 571 and 572 and AND circuits 573 and 576. The 2-bit predecoder 57 predecodes the 2-bit row address signals A1 and A0, and generates four 1-bit predecoded signals A1.A0 (PA0), A1.bA0 (PA1), bA1.A0 (PA2) and bA1.bA0 (PA3). The predecoder 18 includes a total of six 2-bit predecoders 57 having the above arrangement, so that 12-bit row address signals A0 to A11 are predecoded and predecoded 24-bit signals PA0 to PA23 are generated.

Figure 8:
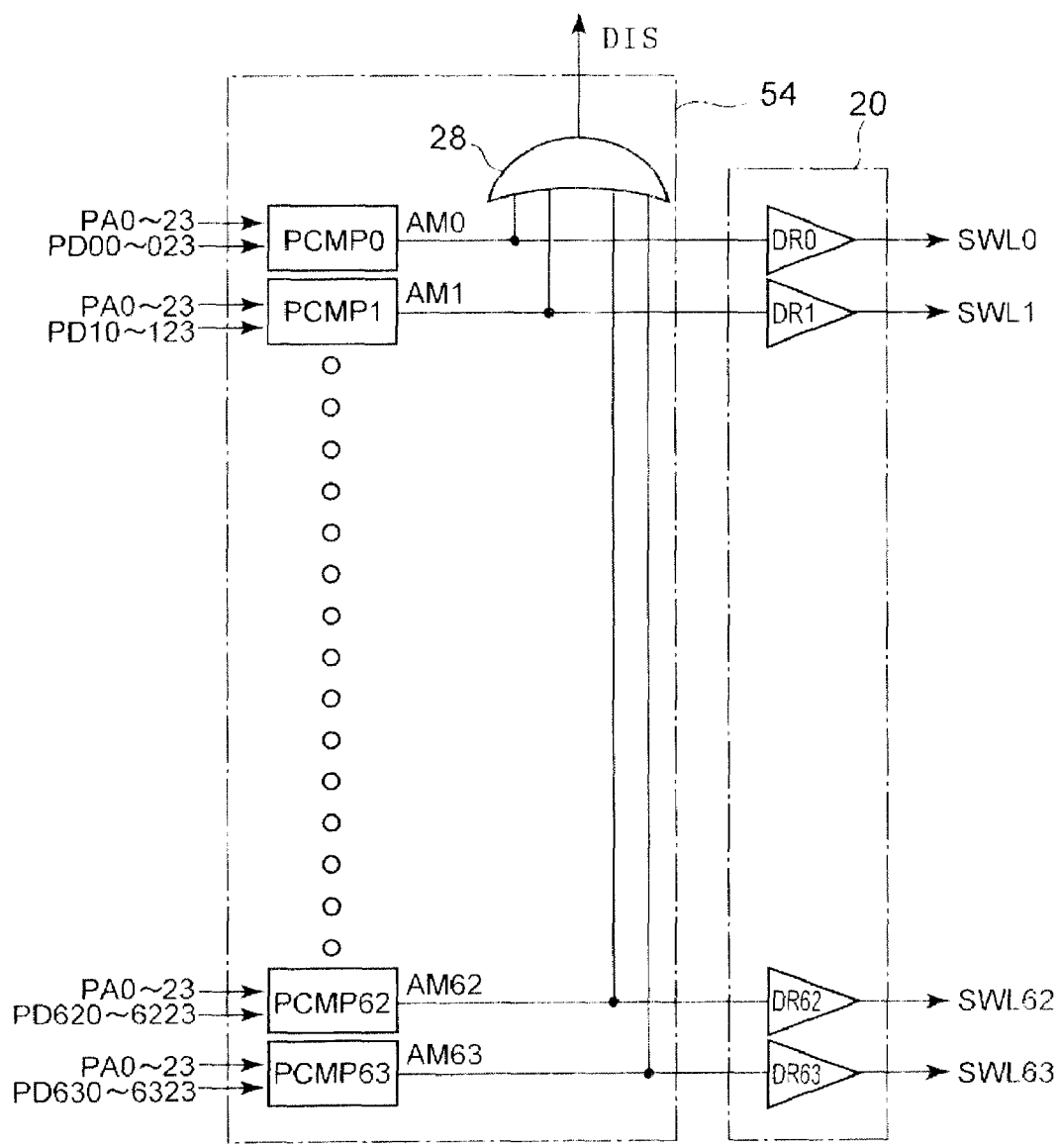
FIG. 8 is a functional block diagram showing the address comparison circuit and the spare row decoder of FIG. 6.

While referring to FIG. 8, unlike the address comparison circuit 26 shown in FIG. 3, the address comparison circuit 54 includes 64 predecode comparators PCMP0 to PCMP63. For example, the predecode comparator PCMP0 compares predecoded signals PA0 to PA23 with corresponding defective predecoded signals PD0 to PD023.

Figure 9:
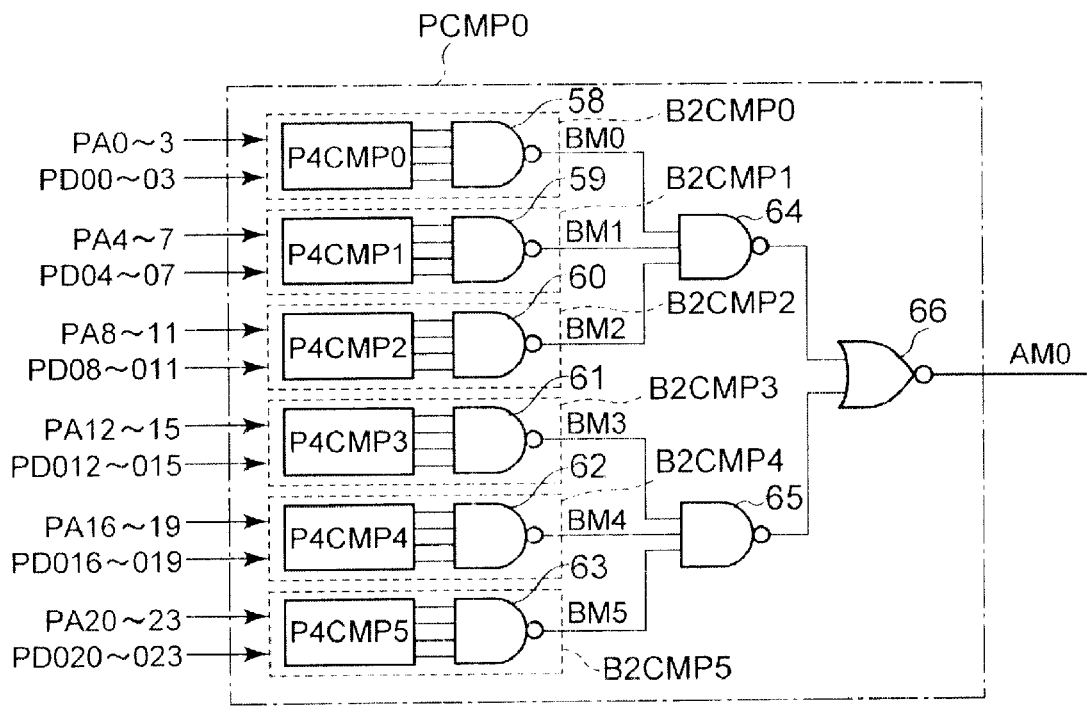
FIG. 9 is a functional block diagram showing the predecode comparator shown in FIG. 8.

As shown in FIG. 9, the predecode comparator PCMP0 includes six predecode 4-bit comparators P4CMP0 to P4CMP5, NAND circuits 58 to 65 and an OR circuit 66. The predecode 4-bit comparator P4CMPO compares four 1-bit predecoded signals PA0 to PA3 (A1.A0, A1.bA0, bA1.A0 and bA1.bA0) with four 1-bit defective predecoded signals PD00 to PD03 (D1.D0, D1.bD0, bD1.D0 and bD1.bD0). The predecode 4-bit comparator P4CMP1 compares four 1-bit predecoded signals PA4 to PA7 (A3.A2, A3.bA2, bA3.A2 and bA3.bA2) with four 1-bit defective predecoded signals PD04 to PD07 (D3.D2, D3.bD2, bD3.D2 and bD3.bD2). The predecode 4-bit comparator P4CMP2 compares four 1-bit predecoded signals PA8 to PA11 (A5.A4, A5.bA4, bA5.A4 and bA5.bA4) with four 1-bit defective predecoded signals PD08 to PD011 (D5.D4, D5.bD4, bD5.D4 and bD5.bD4). The predecode 4-bit comparator P4CMP3 compares four 1-bit predecoded signals PA12 to PA15 (A7.A6, A7.bA6, bA7.A6 and bA7.bA6) with four 1-bit defective predecoded signals PD012 to PD015 (D7.D6, D7.bD6, bD7.D6 and bD7.bD6) The predecode 4-bit comparator P4CMP4 compares four 1-bit predecoded signals PA16 to PA19 (A9.A8, A9.bA8, bA9.A8 and bA9.bA8) with four 1-bit defective predecoded signals PD016 to PD019 (D9.D8, D9.bD8, bD9.D8 and bD9.bD8). The predecode 4-bit comparator P4CMP5 compares four 1-bit predecoded signals PA20 to PA23 (A11.A10, A11.bA10, bA11.A10 and bA11.bA10) with four 1-bit defective predecoded signals PD020 to PD023 (D11.D10, D11.bD10, bD11.D10 and bD11.bD10). The same arrangement is applied for the other predecode comparators PCMP1 to PCMP63.

Figure 10:
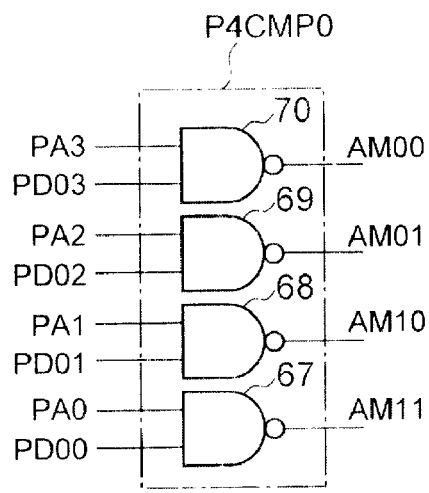
FIG. 10 is a circuit diagram showing the predecode 4-bit comparator shown in FIG. 9.
Figure 11:
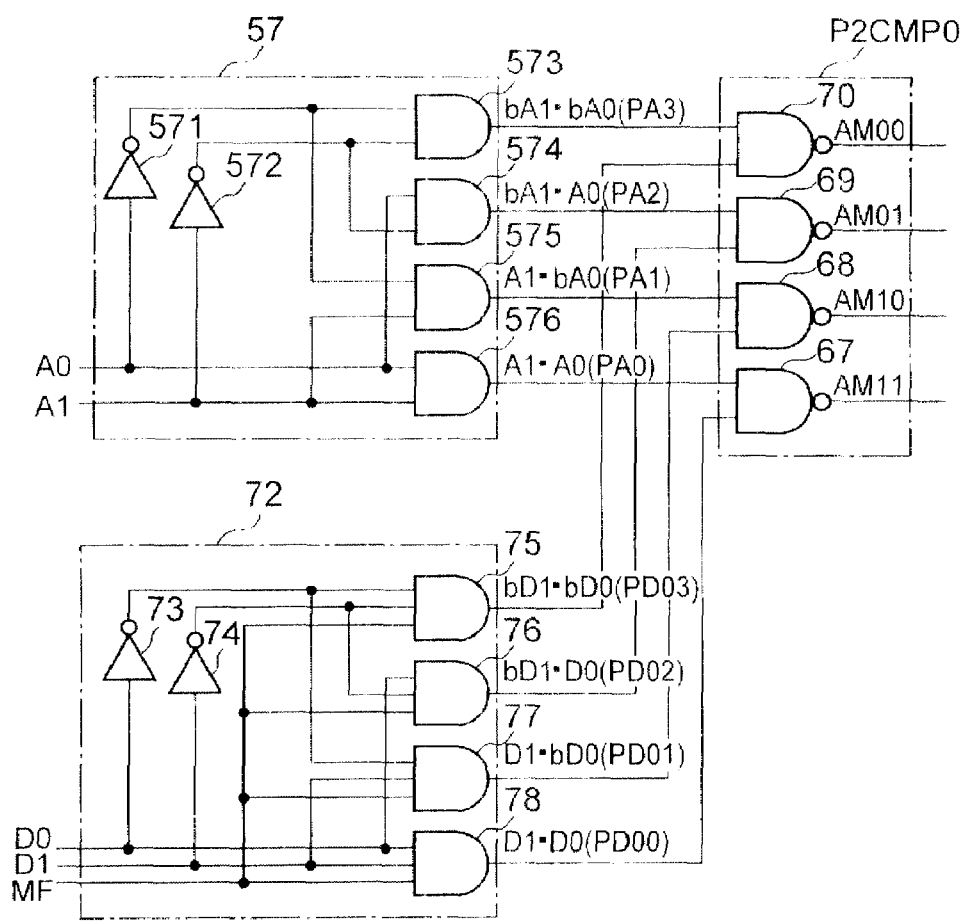
FIG. 11 is a circuit diagram showing the 2-bit predecoder shown in FIG. 7, a 2-bit predecoder included in the redundant predecoder shown in FIG. 6 and the predecode 4-bit comparator shown in FIG. 10.

As shown in FIG. 10, the predecode 4-bit comparator P4CMP0 includes four NAND circuits 67 to 70. As shown in FIG. 11, when the predecoded signal PA0 (A1.A0) matches the defective predecoded signal PD00 (D1.D0), the NAND circuit 67 activates the match signal AM11 at level L, and when the two signals do not match, it deactivates the match signal AM11 at level H. When the predecoded signal PA1 (A1.bA0) matches the defective predecoded signal PD01 (D1.bD0), the NAND circuit 68 activates the match signal AM10 at level L, and when the two signals do not match, it deactivates the match signal AM10 at level H. When the predecoded signal PA2 (bA1.A0) matches the defective predecoded signal PD02 (bD1.D0), the NAND circuit 69 activates the match signal AM01 at level L, and when the two signals do not match, it deactivates the match signal AM01 at level H. When the predecoded signal PA3 (bA1.bA0) matches the defective predecoded signal PD03 (bD1.bD0), the NAND circuit 70 activates the match signal AM00 at level L, and when the two signals do not match, it deactivates the match signal AM00 at level H. The same arrangement is applied for the other predecode 4-bit comparators P4CMP1 to P4CMP5.

The individual redundant predecoders 56, used for defective row address signal DRA, correspond to the two 1-bit defective row address signals D1 and D0, and have a 2-bit predecoder 72, shown in FIG. 11, that includes inverters 73 and 74 and AND circuits 75 to 78. Each 2-bit predecoder 72 predecodes two 1-bit defective row address signals D1 and D0, and generates four 1-bit defective predecoded signals D1.D0 (PD00), D1.bD0 (PD01), bD1.D0 (PD02) and bD1.bD0 (PD03). The redundant predecoders 56 include a total of six 2-bit predecoders 72, described above, whereby twelve 1-bit defective row address signals D0 to D11 are predecoded, and twenty-four 1-bit defective predecoded signals PD00 to PD023 are generated.

In each of the 2-bit predecoders 57, one of the four 1-bit predecoded signals A1.A0, A1.bA0, bA1.A0 and bA1.bA0 goes to level H. Similarly, in each 2-bit predecoder 72, only one of the four 1-bit defective predecoded signals D1.D0, D1.bD0, bD1.D0 and bD1.bD0 goes to level H. Therefore, when the two 1-bit row address signals A0 and A1 match the two 1-bit defective row address signals D0 and D1, only one of the match signals AM11, AM10, AM01 and AM00 is activated at level L.

In the predecode comparator PCMP0 shown in FIG. 9, when one of the match signals AM11, AM10, AM01 and AM00 output by the predecode 4-bit comparator P4CMP0 goes to level L, a 2-bit match signal BM0, output by the NAND circuit 58, is activated at level H. Similarly, when the other ten 1-bit row address signals A2 to A11 match the other ten 1-bit defective row address signals D2 to D11, bit match signals BM1 to BM5, output by the six NAND circuits 58 to 63, are activated at level H, and thus, an address match signal AM0 is activated.

In the predecode comparator PCMP0, the predecode 4-bit comparator P4CMP0 and the NAND circuit 58 constitute a 2-bit B2CMP0. The 2-bit comparator B2CMP0 collectively compares two bits A1 and A0 of external row address signals with two bits D1 and D0 of defective row address signals. When all of these bits match, the bit comparator B2CMP0 activates the 2-bit match signal BM0, and when even one bit of these row address signals does not match, it deactivates the 2-bit match signal BM0. The same arrangement is employed for the other 2-bit comparators B2CMP1 to B2CMP5.

As shown in FIG. 5, the individual program circuits 24 include a master fuse circuit 51 for generating a master fuse signal MF. When a defective row address is not programmed, a fuse is not cut off, so that the master fuse signal MF is deactivated at level L. When a defective row address is programmed, the fuse 48 is cut off, so that the master fuse signal MF is activated at level H.

The master fuse signal MF is input to the AND circuits 75 to 78 of the 2-bit predecoder 72. Therefore, when a defective row address is programmed, the 2-bit predecoder 72 is operated in the previously described manner. However, when a defective row address is not programmed, all of the defective predecoded signals PD00 to PD03 (D1.D0, D1.bD0, bD1.D0 and bD1.bD0) output by the AND circuits 75 to 78 are always maintained at level L, and accordingly, all of the four address match signals AM11, AM10, AM01 and AM00 are always deactivated at level H.

The degree to which partial matches occur will be estimated. When two bits are collectively compared in the above described manner, these two bits match once every four accesses, so that the match occurs 1K times for a total of 4K accesses. Since six predecoder 4-bit comparators P4CMP0 to P4CMP5 are provided, the output nodes are charged/discharged 6K times (=1K×6). Further, as well as the output nodes of the 4-bit comparators P4CMP0 to P4CMP05, the output nodes of the NAND circuits 58 to 63 (the 2-bit comparators B2CMP0 to B2CMP5) at the second stage are charged/discharged 6K times. In addition, since the signals output by the NAND circuits 64 and 65 at the third stage go to level H every 64 accesses, the output nodes are charged/discharged 128 times (=64×2).

Therefore, in the predecode comparator PCMP0, the average number N of the nodes to be charged/discharged for one access can be calculated using the following expression.

$$N=(1K\times 6+1K\times 6+64\times 2)/4K=3.03125$$

This indicates that, in each predecode comparator PCMP, about three nodes on average are charged/discharged for each access. Since 64 predecode comparators PCMP0 to PCMP63 are provided, a total of 194 nodes are charged/discharged for each access. This is less than half, i.e., 46.4%, of the 418 nodes that are conventionally charged/discharged.

As described above, according to the first embodiment, the predecoded signals are employed for comparison instead of address signals, and addresses are compared collectively using two bits. Therefore, in the predecode comparators PCMP0 to PCMP63, the number of nodes that are charged/discharged due to partial matches of addresses is reduced, and the current consumption can be lowered.

Furthermore, since the master fuse signal MF is provided as an enable signal for the 2-bit predecoders 72, when a defective row address is not programmed, nodes in the address comparison circuit 54 are not charged/discharged more than necessary. Thus, the current consumption is further reduced.

Figure 12:
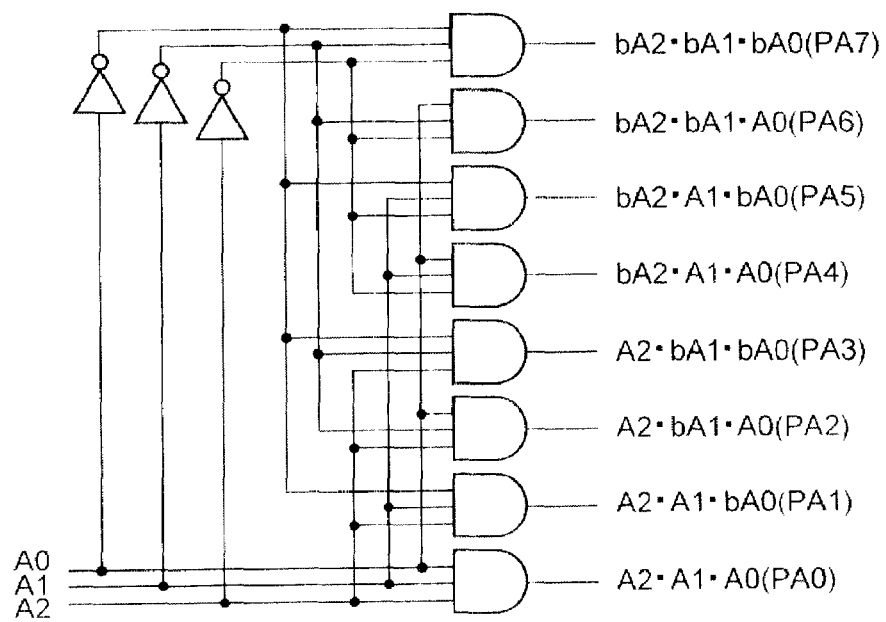
FIG. 12 is a circuit diagram showing a 3-bit predecoder employed for a second embodiment of the present invention.

The following describes a second embodiment of the invention. In the second embodiment, predecoder 80 includes four 3-bit predecoders, as shown in FIG. 12. there may also be a redundant predecoder 56 (shown in FIG. 6), which also includes four 3-bit predecoders 80.

The 3-bit predecoders 80 predecode three 1-bit row address signals A2, A1 and A0, and generate eight 1-bit predecoded signals A2.A1.A0 (PA0), A2.A1.bA0 (PA1), A2.bA1.A0 (PA2), A2.bA1.bA0 (PA3), bA2.A1.A0 (PA4), bA2.A1.bA0 (PA5), bA2.bA1.A0 (PA6) and bA2.bA1.bA0 (PA7). Therefore, the predecoder 18 generates a total of thirty-two 1-bit predecoded signals PA0 to PA31.

Figure 13:
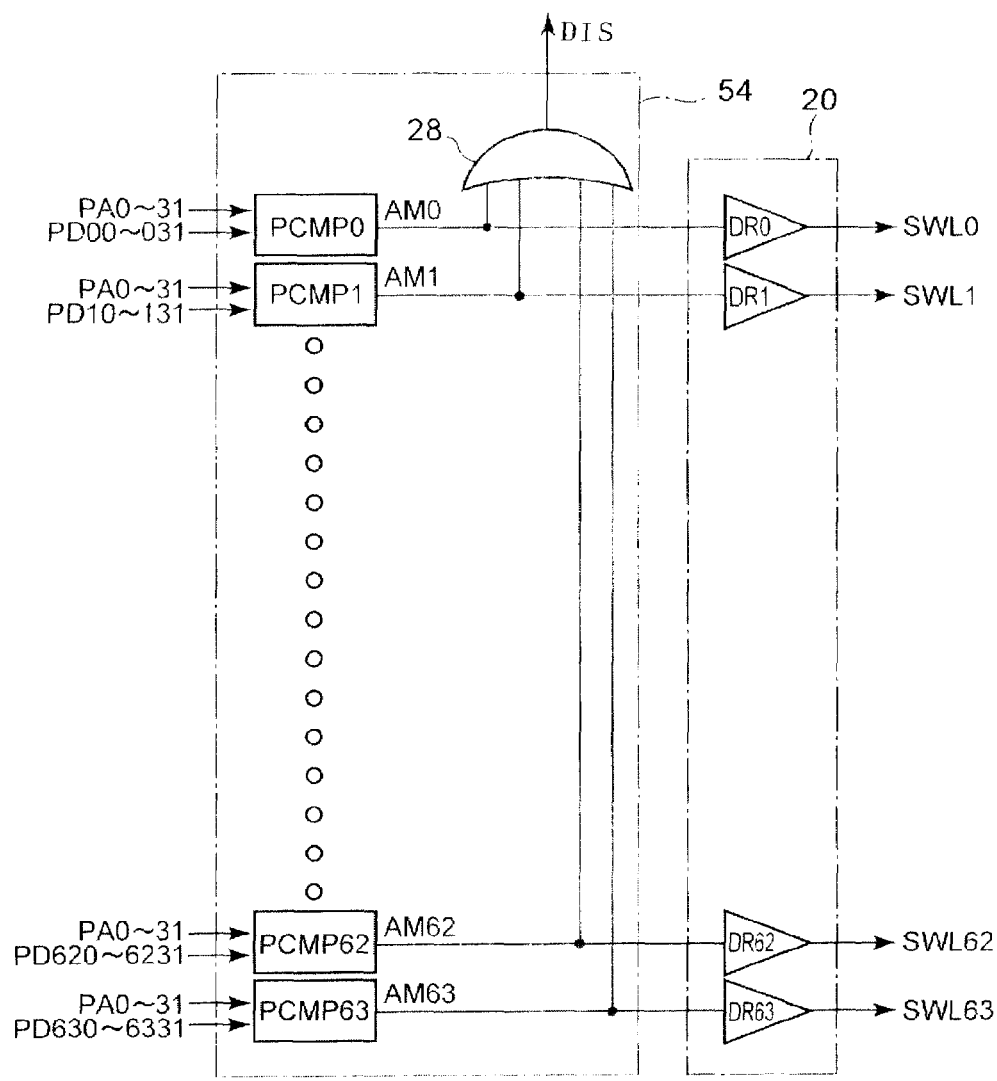
FIG. 13 is a functional block diagram showing an address comparison circuit and a spare row decoder when the 3-bit predecoder shown in FIG. 12 is employed.

As shown in FIG. 13, a predecode comparator PCMP0 compares thirty-two 1-bit predecoded signals PA0 to PA31 with thirty-two corresponding 1-bit defective predecoded signals PD00 to PD031. The other predecode comparators PCMP1 to PCMP63 perform the same processing.

Figure 14:
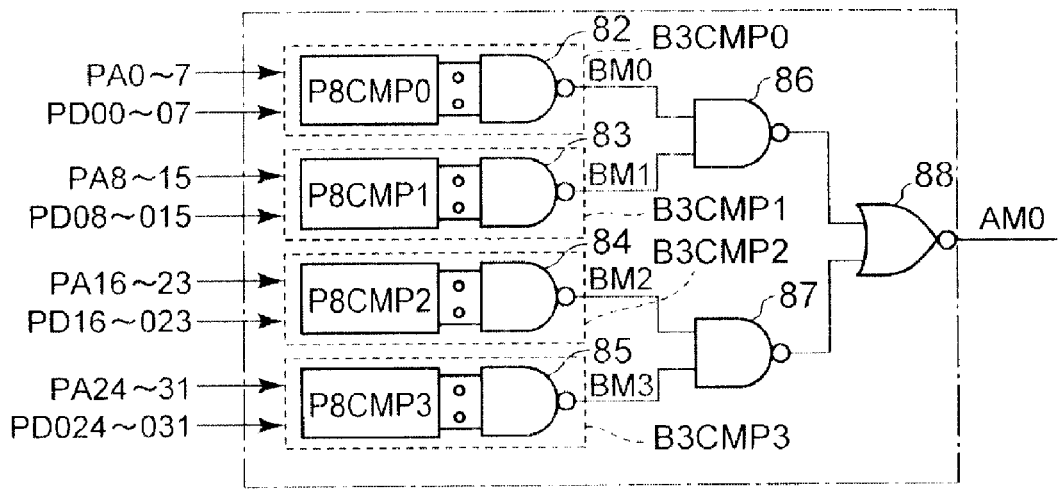
FIG. 14 is a functional block diagram of the predecode comparator shown in FIG. 13.

As shown in FIG. 14, the predecode comparator PCMP0 includes: four predecode 8-bit comparators P8CMP0 to P8CMP3, NAND circuits 82 to 87 and an OR circuit 88. The predecode 8-bit comparator P8CMP0 compares eight 1-bit predecoded signals PA0 to PA7 with eight 1-bit defective predecoded signals PD00 to PD07. The predecode 8-bit comparator P8CMP1 compares eight 1-bit predecoded signals PA8 to PA15 with eight 1-bit defective predecoded signals PD08 to PD015. The predecode 8-bit comparator P8CMP2 compares eight 1-bit predecoded signals PA16 to PA23 with eight 1-bit defective predecoded signals PD016 to PD023; and the predecode 8-bit comparator P8CMP3 compares eight 1-bit predecoded signals PA24 to PA31 with eight 1-bit defective predecoded signals PD024 to PD031. The same arrangement is employed for the other predecode comparators PCMP1 to PCMP63.

The predecode 8-bit comparator P8CMP0 and the NAND circuit 82 constitute the 3-bit comparator B3CMP0. The 3-bit comparator B3CMP0 collectively compares three bits A2, A1 and A0, of external row address signals, with three bits D2, D1 and D0, of the defective row address signals. When all the bits match, the 3-bit comparator B3CMP0 activates a 3-bit match signal BM0, and when at least one bit does not match, it deactivates the 3-bit match signal BM0. The same processing is performed by the other 3-bit comparators B3CMP1 to B3CMP5.

Figure 15:
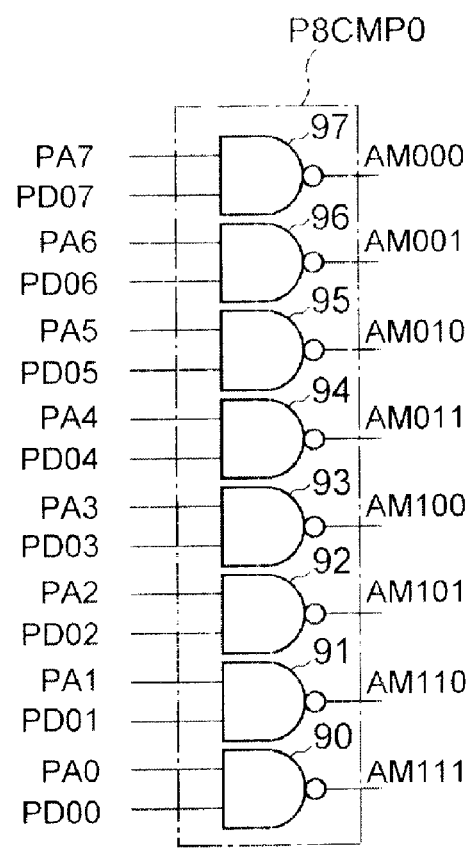
FIG. 15 is a circuit diagram of the predecode 8-bit comparator in FIG. 14.

As shown in FIG. 15, the predecode 8-bit comparator P8CMP0 includes eight NAND circuits 90 to 97. When the predecoded signal PA0 matches the defective predecoded signal PD00, the NAND circuit 90 activates a match signal AM111 at level L, and when these signals do not match, it deactivates the match signal AM111 at level H. The other NAND circuits 91 to 97 perform the same processing. The above described arrangement is employed for the other predecode 8-bit comparators P8CMP1 to P8CMP3.

In this case, in the predecode comparator PCMP0, the average number N of nodes to be charged/discharged for each access is 1.03125. This indicates that, in each predecode comparator PCMP, about one node on average is charged/discharged for each access. Since 64 predecode comparators PCMP0 to PCMP63 are provided, the total of 66 nodes are charged/discharged for each access. This count of 66 is quite small, 15.8% of the conventional 418 nodes.

Further, in the second embodiment, the same four 3-bit predecoders 80 have been employed. However, 2-bit predecoders 57 and the 3-bit predecoders 80 may be employed together. Or, predecoders that can process four bits or more may be employed.

Figure 16:
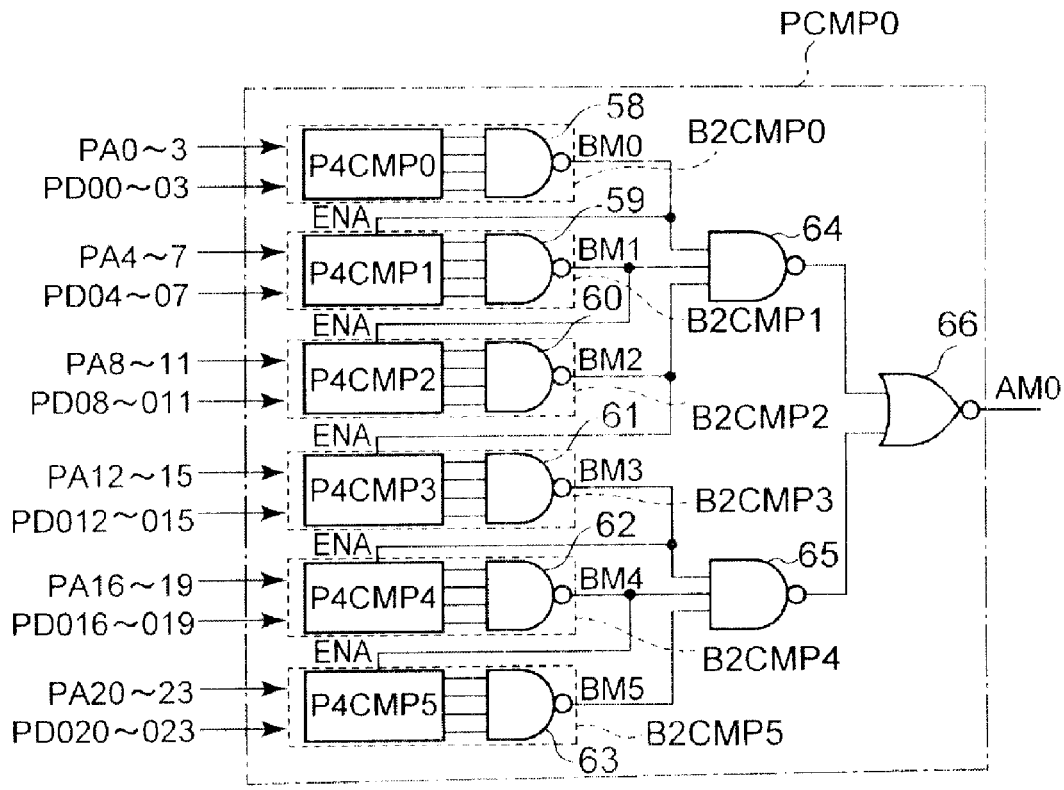
FIG. 16 is a functional block diagram showing a predecode comparator used in a third embodiment of the present invention.
Figure 17:
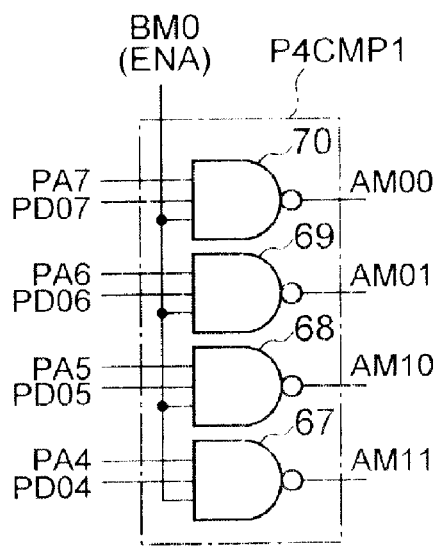
FIG. 17 is a circuit diagram showing the predecode 4-bit comparator shown in FIG. 16.

A third embodiment of the present invention is shown in FIG. 16. FIG. 16 shows a predecode comparator PCMP0 having 2-bit match signals BM0 to BM4, which are the output of 2-bit comparators B2CMP0 to B2CMP4, which may be transmitted as enable signals ENA to 2-bit comparators B2CMP1 to B2CMP5 that are respectively located at higher levels. The 2-bit comparator B2CMP0 is the same as that shown in FIG. 9, while, as shown in FIG. 17, from NAND circuits 67 to 70, the predecode 4-bit comparator P4CMP1 of the 2-bit comparator B2CMP1 receives, as an enable signal ENA, a 2-bit match signal BM0 that is output by the 2-bit comparator B2CMP0. The same arrangement is employed for the other predecode 4-bit comparators P4CMP2 to P4CMP5.

In this case, predecoded signals PA0 to PA3 are compared with defective predecoded signals PD00 to PD03 for each access, and so long as these signals do not match, the 2-bit comparator B2CMP1, located at a higher level, is not operated. Similarly, the 2-bit comparators B2CMP2 to B2CMP5 are not operated unless the predecoded signals at lower levels match.

Since address signals A0 and A1 match once every four accesses, partial matches occur 1K times for 4K accesses. And since address signals A2 and A3 match once each four accesses, partial matches occur 256 times for 4K accesses. Through consideration of up to address signals A10 and A11 in this manner, it has been found that partial matches occurs twice in the 2-bit comparator B2CMP0, so that a total of 2730 (=2×1024+256+64+16+4+1) partial matches occur when addresses are accessed 4K times. Therefore, for 4K address accesses, partial matches occur 0.667 times on average. Since 64 predecode comparators PCMP0 to PCMP63 are provided, 43 nodes are charged/discharged, which is 10.3% the number of conventional nodes. Thus, current consumption can be considerably reduced.

In this third embodiment, the enable signal ENA has been employed for the 2-bit comparator B2CMP. The enable signal can also be employed for the 3-bit comparator B3CMP in FIG. 14 or for a comparator that handles four bits or more. When the enable signal ENA is employed for the 3-bit comparator B3CMP, and when 64 predecode comparators PCMP0 to PCMP63 are prepared, 18 nodes on average are charged/discharged, due to partial matches, for each access. This is 4.3% of the conventional number of nodes, and current consumption can be drastically reduced.

In the third embodiment, the enable signal ENA is not input to the lowermost 2-bit comparator B2CMP0, and the 2-bit match signal BM0 output by the lowermost 2-bit comparator B2CMP0 is transmitted as an enable signal ENA to the 2-bit comparator BCMP1 located at an immediately higher level. However, an arbitrary 2-bit comparator wherein an enable signal ENA is not input can also be used. Further, the direction in which the enable signal ENA is transmitted is not limited to one from a lower bit to a higher bit. While the order in which the enable signal ENA is input is not specifically designated, and the reverse direction may be employed.

In the first, second and third embodiments, 64 spare word lines SWL0 to SWL63 are provided; however, the number of spare word lines is not limited to 64.

At the least, only one spare word line need be provided, and 128 spare word lines may be extended. In this case, the number of nodes to be charged/discharged due to partial matches for a single access, and the ratio of reduction in current consumption are shown in Table 1.

TABLE 1

Ratio of current consumed

| | NODES THAT ARE CHARGED/DISCHARGED DUE TO PARTIAL MATCH FOR ONE ACCESS | CONSUMED CURRENT RATIO |
|---|---|---|
| CONVENTIONAL EXAMPLE | 836 | 1.0 |
| 2-BIT COMPARATOR | 388 | 0.464 |
| 3-BIT COMPARATOR | 132 | 0.158 |
| 2-BIT COMPARATOR USING ENABLE SIGNAL | 86 | 0.103 |
| 3-BIT COMPARATOR USING ENABLE SIGNAL | 36 | 0.043 |

The present invention has been described by employing the embodiments described herein. However, the above embodiments are merely examples for carrying out the present invention. Therefore, the present invention is not limited to these embodiments, and the present invention can be variously modified without departing from the technical scope of the invention.

The invention claimed is:

1. A semiconductor storage device comprising:
a plurality of selection lines (WL);
a spare selection line (SWL);
a program circuit (24) which programs a defective address and generates a defective address signal (DRA) indicating a defective address has been programmed;
an address comparison circuit (26) which compares a plurality of bits comprising an address signal (RA) with a plurality of corresponding bits of the defective address signal (DRA);
if the bits of the address signal (RA) and the defective address signal (DRA) match, activating a first match signal (DIS), or if the bits of the address signal and the defective address signal do not match, deactivating the first match signal (DIS);
a decoder (14) which is activated in accordance with the deactivation of the first match signal (DIS) and drives the plurality of selection lines (WL) in accordance with the address signal (RA); and
a spare decoder (20), for driving the spare selection line (SWL) in accordance with the activation of the first match signal (DIS).

2. A semiconductor storage device according to claim 1, further comprising:
a predecoder (18) for predecoding the address signal (RA) and generating a predecoded signal (PRA); and
a redundant predecoder (56) for predecoding the defective address signal (DRA), and generating a defective pedecoded signal (PDRA),
wherein the address comparison circuit (54) further comprises a predecode comparator (PCMP0) for comparing the predecoded signal (PRA) with the defective predecoded signal (PDRA).

3. A semiconductor storage device according to claim 2, wherein the predecode comparator (PCMP0) comprises:
a plurality of bit comparators (B2CMP0-5), each of the plurality of bit comparators (B2CMP0-5) compares a plurality of bits for a predecoded signal (PA0-3) with a plurality of corresponding bits for a defective predecoded signal (PD00-03), and if the bits of the predecoded signal (PA0-3) and the defective predecoded signal (PD00-03) match, the predecode comparator (PCMP0) activates a second match signal (AM0), if the bits do not match, the predecode comparator (PCMP0) deactivates the second match signal (AM0); and
a logic circuit (28), for activating the first match signal (DIS) in accordance with the activation of the plurality of second match signals (AM0-63).

4. A semiconductor storage device according to claim 3, wherein at least one of the bit comparators (B2CMP0-5) comprises an input signal (ENA) from one of a plurality of third match signals (BM0-5) output by the remaining bit comparators (B2CMP0-5).

5. A semiconductor storage device according to claim 2, further comprising:
a master fuse circuit (44), for activating a master fuse signal (MF0 & bMF0) if a defective address in the program circuit (24) is programmed, or deactivating the master fuse signal (MF0 & bMF0) if a defective address in the program circuit (24) is not programmed;
wherein the redundant predecoder (56) is activated in accordance with the activation of the master fuse signal (MF0 & bMF0), and is deactivated in accordance with the deactivation of the master fuse signal (MF0 & bMF0).

6. A semiconductor storage device comprising:
a plurality of memory cells arranged along rows and along columns;
a plurality of selection lines (WL) and spare word lines (SWL) arranged in rows;
a plurality of column selection lines (CSL) arranged along columns;
a column decoder (16) for driving the column selection lines (CSL) in accordance with a column address signal;
a program circuit (24), for programming a defective row address, and for generating a defective row address signal (DRA) indicating a defective row address has been programmed, the defective row address signal comprising a plurality of defective row address bits;
an address comparison circuit (54), for comparing a row address signal comprising a plurality of row address bits with a plurality of corresponding defective row address bits, and, if the pluralities and row address and defective row address bits match, activating a first match signal (DIS), or if the pluralities and row address and defective row address bits do not match, deactivating the first match signal (DIS);
a row decoder (14), which is activated in accordance with the deactivation of the first match signal (DIS) to drive the selection lines in accordance with the row address signal; and
a spare row decoder (20), for driving the spare selection line (SWL) when the first match signal is activated (DIS).

7. A semiconductor storage device according to claim 6, further comprising:
a predecoder (18) for predecoding the row address signal (RA) and generating a predecoded row address signal (PRA); and
a redundant predecoder (56) for predecoding the defective row address signal, and generating a defective pedecoded row address signal (PDRA);
wherein the address comparison circuit (54) further comprises a predecode comparator (PCMP0) for comparing a predecoded signal (PA0-3) with a defective predecode signal PD00-03).

* * * * *